United States Patent
Lin et al.

(10) Patent No.: US 8,897,706 B1
(45) Date of Patent: *Nov. 25, 2014

(54) BLUETOOTH WIDEBAND SCAN MODE

(71) Applicant: Marvell International Ltd., Hamilton (BM)

(72) Inventors: Yui Lin, Cupertino, CA (US); Lawrence Tse, Fremont, CA (US); Poh Boon Leong, Singapore (SG); Minko Tsai, Mountain View, CA (US); Robert Mack, San Jose, CA (US); Yungping Hsu, Saratoga, CA (US)

(73) Assignee: Marvell International Ltd., Hamilton (BM)

( * ) Notice: Subject to any disclaimer, the term of this patent is extended or adjusted under 35 U.S.C. 154(b) by 0 days.

This patent is subject to a terminal disclaimer.

(21) Appl. No.: 13/757,276

(22) Filed: Feb. 1, 2013

Related U.S. Application Data

(63) Continuation of application No. 12/190,251, filed on Aug. 12, 2008, now Pat. No. 8,369,782.

(60) Provisional application No. 60/955,497, filed on Aug. 13, 2007.

(51) Int. Cl.
*H04B 7/00* (2006.01)
*H04B 1/18* (2006.01)
*H04W 4/00* (2009.01)
*H04B 7/26* (2006.01)

(52) U.S. Cl.
CPC .................................. *H04B 7/2612* (2013.01)
USPC ........................ 455/41.2; 455/161.1; 455/434

(58) Field of Classification Search
CPC .. H04W 24/00; H04W 16/14; H04W 52/0245
USPC ...................... 455/41.2, 161.1, 434
See application file for complete search history.

(56) References Cited

U.S. PATENT DOCUMENTS

| 4,337,463 | A | 6/1982 | Vangen |
| 4,805,215 | A | 2/1989 | Miller |

(Continued)

FOREIGN PATENT DOCUMENTS

| CN | 102067689 | 5/2011 |
| EP | 1860827 | 11/2007 |

(Continued)

OTHER PUBLICATIONS

"3rd Generation Partnership Project; Technical Specification Group Radio Access Network; Evolved Universal Terrestrial Radio Access (E-UTRA); Radio Resource Control (RRC); Protocol Specification (Release 10)", 3GPP TS 36.331; V10.5.0; 3GPP Organizational Partners, 2012, 302 pages.

(Continued)

*Primary Examiner* — Kent Chang
*Assistant Examiner* — Kuo Woo

(57) ABSTRACT

Different scan modes are provided for Bluetooth devices. In at least some embodiments, a narrowband scanning mode looks for signal energy on individual transmission frequencies at a time. By looking for signal energy rather than decoding transmitted packets, at least some of the components in a Bluetooth device can remain in an idle or rest state. A midband scanning mode looks for signal energy across multiple different frequencies at a time. Again, by looking for signal energy across multiple different frequencies rather than decoding transmitted packets, at least some of the components in a Bluetooth device can remain in an idle or rest state. A wideband scanning mode looks for signal energies across all relevant frequencies at a time. At least some embodiments enable a Bluetooth device to switch between scanning modes.

20 Claims, 11 Drawing Sheets

(56) References Cited

U.S. PATENT DOCUMENTS

| | | |
|---|---|---|
| 5,347,234 A | 9/1994 | Gersbach et al. |
| 5,634,207 A | 5/1997 | Yamaji et al. |
| 5,673,291 A | 9/1997 | Dent |
| 5,708,656 A | 1/1998 | Noneman et al. |
| 5,847,616 A | 12/1998 | Ng et al. |
| 5,995,819 A | 11/1999 | Yamaji et al. |
| 6,167,245 A | 12/2000 | Welland et al. |
| 6,285,262 B1 | 9/2001 | Kuriyama |
| 6,320,919 B1 | 11/2001 | Khayrallah et al. |
| 6,347,091 B1 | 2/2002 | Wallentin et al. |
| 6,366,622 B1 | 4/2002 | Brown et al. |
| 6,374,117 B1 | 4/2002 | Denkert et al. |
| 6,438,364 B1 | 8/2002 | Waite |
| 6,452,458 B1 | 9/2002 | Tanimoto |
| 6,509,777 B2 | 1/2003 | Razavi et al. |
| 6,519,461 B1 | 2/2003 | Andersson et al. |
| 6,535,037 B2 | 3/2003 | Maligeorgos |
| 6,553,229 B1 | 4/2003 | Dent |
| 6,640,308 B1 | 10/2003 | Keyghobad et al. |
| 6,650,195 B1 | 11/2003 | Brunn et al. |
| 6,675,328 B1 | 1/2004 | Krishnamachari et al. |
| 6,738,358 B2 | 5/2004 | Bist et al. |
| 6,741,846 B1 | 5/2004 | Welland et al. |
| 6,741,862 B2 | 5/2004 | Chung et al. |
| 6,754,189 B1 | 6/2004 | Cloutier et al. |
| 6,816,452 B1 | 11/2004 | Maehata |
| 6,816,718 B2 | 11/2004 | Yan et al. |
| 6,922,433 B2 | 7/2005 | Tamura |
| 6,934,566 B2 | 8/2005 | Kang et al. |
| 6,946,950 B1 | 9/2005 | Ueno et al. |
| 6,954,708 B2 | 10/2005 | Rakshani et al. |
| 7,079,811 B2 | 7/2006 | Lee et al. |
| 7,139,540 B2 | 11/2006 | Wu et al. |
| 7,173,431 B1 | 2/2007 | Lo et al. |
| 7,206,840 B2 | 4/2007 | Choi et al. |
| 7,212,798 B1 | 5/2007 | Adams et al. |
| 7,239,882 B1 | 7/2007 | Cook |
| 7,257,095 B2 | 8/2007 | Liu |
| 7,286,009 B2 | 10/2007 | Andersen et al. |
| 7,298,183 B2 | 11/2007 | Mirzaei et al. |
| 7,310,023 B2 | 12/2007 | Cha et al. |
| 7,319,849 B2 | 1/2008 | Womac |
| 7,342,895 B2 | 3/2008 | Serpa et al. |
| 7,355,416 B1 | 4/2008 | Darshan |
| 7,377,441 B2 | 5/2008 | Wiklof et al. |
| 7,395,040 B2 | 7/2008 | Behzad |
| 7,403,018 B1 | 7/2008 | Lo et al. |
| 7,529,548 B2 | 5/2009 | Sebastian |
| 7,564,826 B2 | 7/2009 | Sherman et al. |
| 7,595,768 B2 | 9/2009 | Li et al. |
| 7,599,671 B2 | 10/2009 | Kopikare et al. |
| 7,616,935 B2 | 11/2009 | Fernandez-Corbaton et al. |
| 7,626,966 B1 | 12/2009 | Ruiter et al. |
| 7,627,025 B2 | 12/2009 | Wang et al. |
| 7,627,026 B2 | 12/2009 | Wang et al. |
| 7,636,388 B2 | 12/2009 | Wang et al. |
| 7,656,205 B2 | 2/2010 | Chen et al. |
| 7,659,003 B2 | 2/2010 | Aoki et al. |
| 7,672,645 B2 | 3/2010 | Kilpatrick et al. |
| 7,689,190 B2 | 3/2010 | Kerth et al. |
| 7,711,004 B2 | 5/2010 | Xu |
| 7,717,342 B2 | 5/2010 | Wang |
| 7,734,253 B2 | 6/2010 | Chen et al. |
| 7,826,411 B2 | 11/2010 | Gonikberg et al. |
| 7,849,333 B2 | 12/2010 | Schindler |
| 7,876,786 B2 | 1/2011 | Bahl et al. |
| 7,881,746 B2 | 2/2011 | Desai |
| 7,898,948 B2 | 3/2011 | DiGirolamo et al. |
| 7,936,714 B1 | 5/2011 | Karr et al. |
| 7,957,340 B2 | 6/2011 | Choi et al. |
| 7,966,036 B2 | 6/2011 | Kojima |
| 7,995,544 B2 | 8/2011 | Benveniste |
| 8,000,715 B2 | 8/2011 | Melpignano et al. |
| 8,014,329 B2 | 9/2011 | Gong |
| 8,045,922 B2 | 10/2011 | Sherman et al. |
| 8,060,017 B2 | 11/2011 | Schlicht et al. |
| 8,072,913 B2 | 12/2011 | Desai |
| 8,077,652 B2 | 12/2011 | Thesling |
| 8,078,111 B2 | 12/2011 | Jovicic et al. |
| 8,081,038 B2 | 12/2011 | Lee et al. |
| 8,107,391 B2 | 1/2012 | Wu et al. |
| 8,126,502 B2 | 2/2012 | Trainin |
| 8,139,670 B1 | 3/2012 | Son et al. |
| 8,140,075 B2 | 3/2012 | Watanabe |
| 8,149,715 B1 | 4/2012 | Goel |
| 8,150,328 B2 | 4/2012 | Chaudhri et al. |
| 8,165,102 B1 | 4/2012 | Vleugels et al. |
| 8,170,002 B2 | 5/2012 | Wentink |
| 8,170,546 B2 | 5/2012 | Bennett |
| 8,189,506 B2 | 5/2012 | Kneckt et al. |
| 8,204,015 B2 | 6/2012 | Chaudhri et al. |
| 8,229,087 B2 | 7/2012 | Sumioka et al. |
| 8,254,296 B1 | 8/2012 | Lambert |
| 8,256,681 B2 | 9/2012 | Wang |
| 8,274,894 B2 | 9/2012 | Kneckt et al. |
| 8,275,314 B1 | 9/2012 | Lin |
| 8,310,967 B1 | 11/2012 | Goel |
| 8,315,564 B2 | 11/2012 | Banerjea |
| 8,340,034 B1 | 12/2012 | Lee |
| 8,364,188 B2 | 1/2013 | Srinivasan et al. |
| 8,369,782 B1 * | 2/2013 | Lin et al. .................. 455/41.2 |
| 8,472,427 B1 | 6/2013 | Wheeler et al. |
| 8,472,968 B1 | 6/2013 | Kim |
| 8,493,992 B2 | 7/2013 | Sella et al. |
| 8,496,181 B2 | 7/2013 | Wang |
| 8,526,348 B2 | 9/2013 | Desai |
| 8,532,041 B1 | 9/2013 | Lambert et al. |
| 8,553,561 B1 | 10/2013 | Chokshi et al. |
| 8,571,479 B2 | 10/2013 | Banerjea |
| 8,577,305 B1 | 11/2013 | Rossi et al. |
| 8,588,705 B1 | 11/2013 | Tsui et al. |
| 8,599,814 B1 | 12/2013 | Vleugels et al. |
| 8,600,324 B1 | 12/2013 | Cousinard et al. |
| 8,626,067 B2 | 1/2014 | Ko et al. |
| 8,649,734 B1 | 2/2014 | Lin et al. |
| 8,655,278 B2 | 2/2014 | Laroche et al. |
| 8,655,279 B2 | 2/2014 | Banerjea |
| 8,665,848 B2 | 3/2014 | Wentink |
| 8,699,430 B2 | 4/2014 | Chandramouli et al. |
| 2002/0025810 A1 | 2/2002 | Takayama et al. |
| 2002/0049854 A1 | 4/2002 | Cox et al. |
| 2002/0102941 A1 | 8/2002 | Kuiri et al. |
| 2003/0040316 A1 | 2/2003 | Stanforth et al. |
| 2003/0148750 A1 | 8/2003 | Yan et al. |
| 2003/0198200 A1 | 10/2003 | Diener et al. |
| 2004/0044489 A1 | 3/2004 | Jones et al. |
| 2004/0063403 A1 | 4/2004 | Durrant |
| 2004/0105401 A1 | 6/2004 | Lee |
| 2004/0110470 A1 | 6/2004 | Tsien et al. |
| 2004/0162106 A1 | 8/2004 | Monroe et al. |
| 2004/0192222 A1 | 9/2004 | Vaisanen et al. |
| 2004/0198297 A1 | 10/2004 | Oh et al. |
| 2004/0214575 A1 | 10/2004 | Jovanovic |
| 2004/0233881 A1 | 11/2004 | Kang et al. |
| 2005/0018641 A1 | 1/2005 | Zhao et al. |
| 2005/0025104 A1 | 2/2005 | Fischer et al. |
| 2005/0025174 A1 | 2/2005 | Fischer et al. |
| 2005/0038876 A1 | 2/2005 | Chaudhuri |
| 2005/0058151 A1 | 3/2005 | Yeh |
| 2005/0064840 A1 | 3/2005 | Heydari et al. |
| 2005/0090218 A1 | 4/2005 | Ishida et al. |
| 2005/0120119 A1 | 6/2005 | Bhanu et al. |
| 2005/0135360 A1 | 6/2005 | Shin et al. |
| 2005/0174962 A1 | 8/2005 | Gurevich |
| 2005/0186962 A1 | 8/2005 | Yoneyama et al. |
| 2005/0206554 A1 | 9/2005 | Yamaura |
| 2005/0215197 A1 | 9/2005 | Chen et al. |
| 2005/0250528 A1 | 11/2005 | Song et al. |
| 2005/0254423 A1 | 11/2005 | Berghoff |
| 2005/0281278 A1 | 12/2005 | Black et al. |
| 2006/0007863 A1 | 1/2006 | Naghian |
| 2006/0049880 A1 | 3/2006 | Rein et al. |
| 2006/0063509 A1 | 3/2006 | Pincu et al. |
| 2006/0079232 A1 | 4/2006 | Omori et al. |

(56) References Cited

U.S. PATENT DOCUMENTS

| | | |
|---|---|---|
| 2006/0114044 A1 | 6/2006 | Mintchev et al. |
| 2006/0120338 A1 | 6/2006 | Hwang et al. |
| 2006/0128308 A1 | 6/2006 | Michael et al. |
| 2006/0128347 A1 | 6/2006 | Piriyapoksombut et al. |
| 2006/0189359 A1 | 8/2006 | Kammer et al. |
| 2006/0199565 A1 | 9/2006 | Ammirata |
| 2006/0200862 A1 | 9/2006 | Olson et al. |
| 2006/0215601 A1 | 9/2006 | Vleugels et al. |
| 2006/0223474 A1 | 10/2006 | Yoshizaki et al. |
| 2006/0239443 A1 | 10/2006 | Oxford et al. |
| 2006/0251198 A1 | 11/2006 | Ma et al. |
| 2006/0252418 A1 | 11/2006 | Quinn et al. |
| 2006/0264179 A1 | 11/2006 | Bonneville et al. |
| 2006/0268756 A1 | 11/2006 | Wang et al. |
| 2006/0268804 A1 | 11/2006 | Kim et al. |
| 2006/0281404 A1 | 12/2006 | Lee et al. |
| 2006/0282541 A1 | 12/2006 | Hiroki |
| 2006/0282667 A1 | 12/2006 | Kim et al. |
| 2006/0286935 A1 | 12/2006 | Utsunomiya et al. |
| 2007/0010237 A1 | 1/2007 | Jones et al. |
| 2007/0010247 A1 | 1/2007 | Mouna-Kingue et al. |
| 2007/0014314 A1 | 1/2007 | O'Neil |
| 2007/0026810 A1 | 2/2007 | Love et al. |
| 2007/0077908 A1 | 4/2007 | Vorenkamp et al. |
| 2007/0081553 A1 | 4/2007 | Cicchetti et al. |
| 2007/0103829 A1 | 5/2007 | Darshan et al. |
| 2007/0109973 A1 | 5/2007 | Trachewsky |
| 2007/0142080 A1 | 6/2007 | Tanaka et al. |
| 2007/0173286 A1 | 7/2007 | Carter et al. |
| 2007/0178888 A1 | 8/2007 | Alfano et al. |
| 2007/0183443 A1 | 8/2007 | Won |
| 2007/0200622 A1 | 8/2007 | Filoramo et al. |
| 2007/0202814 A1 | 8/2007 | Ono et al. |
| 2007/0206519 A1 | 9/2007 | Hansen et al. |
| 2007/0206762 A1 | 9/2007 | Chandra et al. |
| 2007/0223430 A1 | 9/2007 | Desai et al. |
| 2007/0238482 A1 | 10/2007 | Rayzman et al. |
| 2007/0242645 A1 | 10/2007 | Stephenson et al. |
| 2007/0264959 A1 | 11/2007 | Carrez |
| 2007/0268862 A1 | 11/2007 | Singh et al. |
| 2007/0280471 A1 | 12/2007 | Fallahi et al. |
| 2007/0286298 A1 | 12/2007 | Choi et al. |
| 2007/0297388 A1 | 12/2007 | Appaji et al. |
| 2008/0027033 A1 | 1/2008 | Gonda et al. |
| 2008/0045162 A1 | 2/2008 | Rofougaran et al. |
| 2008/0056201 A1 | 3/2008 | Bennett |
| 2008/0069034 A1 | 3/2008 | Buddhikot et al. |
| 2008/0076466 A1 | 3/2008 | Larsson |
| 2008/0080446 A1 | 4/2008 | Chung |
| 2008/0095058 A1 | 4/2008 | Dalmases et al. |
| 2008/0095059 A1 | 4/2008 | Chu |
| 2008/0111639 A1 | 5/2008 | Ryckaert et al. |
| 2008/0129118 A1 | 6/2008 | Diab |
| 2008/0130595 A1 | 6/2008 | Abdel-Kader |
| 2008/0137580 A1 | 6/2008 | Axelsson et al. |
| 2008/0139212 A1 | 6/2008 | Chen et al. |
| 2008/0161031 A1 | 7/2008 | Tu |
| 2008/0170550 A1 | 7/2008 | Liu et al. |
| 2008/0181154 A1 | 7/2008 | Sherman |
| 2008/0187003 A1 | 8/2008 | Becker |
| 2008/0232287 A1 | 9/2008 | Shao et al. |
| 2008/0259846 A1 | 10/2008 | Gonikberg et al. |
| 2008/0261552 A1 | 10/2008 | Chung |
| 2008/0261640 A1 | 10/2008 | Yoshida |
| 2008/0262991 A1 | 10/2008 | Kapoor et al. |
| 2008/0272818 A1 | 11/2008 | Ko |
| 2008/0279163 A1 | 11/2008 | Desai |
| 2008/0310067 A1 | 12/2008 | Diab et al. |
| 2008/0320108 A1 | 12/2008 | Murty et al. |
| 2009/0005061 A1 | 1/2009 | Ward et al. |
| 2009/0010210 A1 | 1/2009 | Hiertz et al. |
| 2009/0067396 A1 | 3/2009 | Fischer |
| 2009/0137206 A1 | 5/2009 | Sherman et al. |
| 2009/0143043 A1 | 6/2009 | Yoshizaki et al. |
| 2009/0168686 A1 | 7/2009 | Love et al. |
| 2009/0168725 A1 | 7/2009 | Mishra |
| 2009/0170497 A1 | 7/2009 | Miao et al. |
| 2009/0175250 A1 | 7/2009 | Mathur et al. |
| 2009/0190541 A1 | 7/2009 | Abedi |
| 2009/0196210 A1 | 8/2009 | Desai |
| 2009/0202013 A1 | 8/2009 | Sebastian |
| 2009/0209288 A1 | 8/2009 | Rofougaran |
| 2009/0235316 A1 | 9/2009 | Wu et al. |
| 2009/0239471 A1 | 9/2009 | Tran et al. |
| 2009/0245133 A1 | 10/2009 | Gupta et al. |
| 2009/0245279 A1 | 10/2009 | Wan et al. |
| 2009/0247217 A1 | 10/2009 | Hsu et al. |
| 2009/0268652 A1 | 10/2009 | Kneckt et al. |
| 2009/0280762 A1 | 11/2009 | Park et al. |
| 2009/0285264 A1 | 11/2009 | Aldana et al. |
| 2009/0291640 A1 | 11/2009 | Bhattad et al. |
| 2009/0311961 A1 | 12/2009 | Banerjea |
| 2009/0312027 A1 | 12/2009 | Foschini et al. |
| 2009/0321056 A1 | 12/2009 | Ran et al. |
| 2010/0009675 A1 | 1/2010 | Wijting et al. |
| 2010/0011231 A1 | 1/2010 | Banerjea et al. |
| 2010/0029325 A1 | 2/2010 | Wang et al. |
| 2010/0052796 A1 | 3/2010 | Menkhoff |
| 2010/0061244 A1 | 3/2010 | Meier et al. |
| 2010/0062799 A1 | 3/2010 | Ishii et al. |
| 2010/0069112 A1 | 3/2010 | Sun et al. |
| 2010/0080319 A1 | 4/2010 | Blocher et al. |
| 2010/0082957 A1 | 4/2010 | Iwata |
| 2010/0097952 A1 | 4/2010 | McHenry et al. |
| 2010/0103867 A1 | 4/2010 | Kishiyama et al. |
| 2010/0130129 A1 | 5/2010 | Chang et al. |
| 2010/0135256 A1 | 6/2010 | Lee et al. |
| 2010/0138549 A1 | 6/2010 | Goel et al. |
| 2010/0165896 A1 | 7/2010 | Gong et al. |
| 2010/0216497 A1 | 8/2010 | Kawasaki |
| 2010/0238793 A1 | 9/2010 | Alfano et al. |
| 2010/0248734 A1 | 9/2010 | Yamazaki et al. |
| 2010/0283654 A1 | 11/2010 | Waheed et al. |
| 2010/0293293 A1 | 11/2010 | Beser |
| 2010/0303026 A1 | 12/2010 | Chaudhri et al. |
| 2010/0316027 A1 | 12/2010 | Rick et al. |
| 2010/0322213 A1 | 12/2010 | Liu et al. |
| 2011/0002226 A1 | 1/2011 | Bhatti |
| 2011/0007675 A1 | 1/2011 | Chiou et al. |
| 2011/0009074 A1 | 1/2011 | Hsu et al. |
| 2011/0021240 A1 | 1/2011 | Hiltunen et al. |
| 2011/0053522 A1 | 3/2011 | Rofougaran et al. |
| 2011/0097998 A1 | 4/2011 | Ko et al. |
| 2011/0103363 A1 | 5/2011 | Bennett |
| 2011/0161697 A1 | 6/2011 | Qi et al. |
| 2011/0164538 A1 | 7/2011 | Karr et al. |
| 2011/0188391 A1 | 8/2011 | Sella et al. |
| 2011/0194519 A1 | 8/2011 | Habetha |
| 2011/0205924 A1 | 8/2011 | Gonikberg et al. |
| 2011/0274040 A1 | 11/2011 | Pani et al. |
| 2012/0020319 A1 | 1/2012 | Song et al. |
| 2012/0025921 A1 | 2/2012 | Yang et al. |
| 2012/0087341 A1 | 4/2012 | Jang et al. |
| 2012/0099476 A1 | 4/2012 | Mahaffy et al. |
| 2012/0115420 A1 | 5/2012 | Trainin |
| 2012/0195397 A1 | 8/2012 | Sayana et al. |
| 2012/0212628 A1 | 8/2012 | Wu et al. |
| 2012/0213162 A1 | 8/2012 | Koo et al. |
| 2012/0213208 A1 | 8/2012 | Hsu et al. |
| 2012/0244805 A1 | 9/2012 | Haikonen et al. |
| 2012/0276938 A1 | 11/2012 | Wagholikar et al. |
| 2012/0294396 A1 | 11/2012 | Desai |
| 2012/0327779 A1 | 12/2012 | Gell et al. |
| 2013/0045687 A1 | 2/2013 | Banerjea |
| 2013/0045688 A1 | 2/2013 | Banerjea |
| 2013/0057344 A1 | 3/2013 | Touzard et al. |
| 2013/0114548 A1 | 5/2013 | Banerjea |
| 2013/0130684 A1 | 5/2013 | Gomes et al. |
| 2013/0176903 A1 | 7/2013 | Bijwe |
| 2013/0225068 A1 | 8/2013 | Kiminki et al. |
| 2013/0287043 A1 | 10/2013 | Nanda et al. |
| 2014/0003318 A1 | 1/2014 | Desai |
| 2014/0004794 A1 | 1/2014 | Contaldo et al. |

(56) References Cited

U.S. PATENT DOCUMENTS

| | | |
|---|---|---|
| 2014/0043966 A1 | 2/2014 | Lee et al. |
| 2014/0044106 A1 | 2/2014 | Bhagwat |
| 2014/0073251 A1 | 3/2014 | Banerjea |

FOREIGN PATENT DOCUMENTS

| | | |
|---|---|---|
| JP | 2006174162 | 6/2006 |
| JP | 200728568 | 2/2007 |
| JP | 2007028568 | 2/2007 |
| WO | WO-0178252 | 10/2001 |
| WO | WO-02082751 | 10/2002 |
| WO | WO-02091623 | 11/2002 |
| WO | WO 2006043956 | 4/2006 |
| WO | WO 2006090254 | 8/2006 |
| WO | WO 2007008981 | 1/2007 |
| WO | WO 2007064822 | 6/2007 |
| WO | WO 2008707777 | 6/2008 |
| WO | WO 2009101567 | 8/2009 |
| WO | WO 2011056878 | 5/2011 |
| WO | WO 2013104989 | 7/2013 |
| WO | WO 2013119810 | 8/2013 |

OTHER PUBLICATIONS

"Advisory Action", U.S. Appl. No. 12/646,721, Aug. 13, 2013, 3 pages.

Mazzanti, et al.,"Analysis and Design of Injection-Locked LC Dividers for Quadrature Generation", IEEE Journal of Solid-State Circuits, vol. 39, No. 9, Sep. 2004, pp. 1425-1433.

"Draft Standard for Information Technology—Telecommunications and information exchange between systems—Local and metropolitan area networks—Specific requirements", IEEE P802.11s/D1.03, Apr. 2007, 251 pages.

"Final Office Action", U.S. Appl. No. 12/358,955, Mar. 18, 2013, 12 pages.

"Final Office Action", U.S. Appl. No. 12/646,802, Nov. 15, 2012, 15 pages.

"Final Office Action", U.S. Appl. No. 12/646,721, Jun. 6, 2013, 16 pages.

"Final Office Action", U.S. Appl. No. 12/484,563, Apr. 24, 2012, 18 pages.

"Final Office Action", U.S. Appl. No. 12/616,454, Apr. 11, 2012, 19 pages.

"Final Office Action", U.S. Appl. No. 12/186,429, Oct. 13, 2011, 23 pages.

"Final Office Action", U.S. Appl. No. 12/542,845, Sep. 25, 2012, 23 pages.

"Final Office Action", U.S. Appl. No. 12/358,955, Feb. 17, 2012, 26 pages.

"Final Office Action", U.S. Appl. No. 12/487,425, May 3, 2012, 9 pages.

"Foreign Office Action", Chinese Application No. 200980122587.0, Sep. 10, 2013, 11 Pages.

"Further Higher Data Rate Extension in the 2.4 GHz Band", IEEE P802.11g/D8.2,Draft Supplement to Standard [for] Information Technology, Apr 2003, 69 pages.

Haas, et al.,"Gossip-Based Ad Hoc Routing", IEEE/ACM Transactions on Networking, vol. 14, No. 3, Jun. 2006, pp. 479-491.

"IEEE Standard for Information Technology—Telecommunications and information exchange between systems—Local and metropolitan area networks—Specific requirements Part 11: Wireless LAN Medium Access Control (MAC) and Physical Layer (PHY) specifications Amendment", IEEE Computer Society, Oct. 14, 2010, pp. 12-18, 23, 65-68.

"International Search Report and Written Opinion", PCT Application PCT/US2012/035597, Aug. 6, 2012, 13 pages.

"Non-Final Office Action", U.S. Appl. No. 12/167,841, Jul. 15, 2011, 10 pages.

"Non-Final Office Action", U.S. Appl. No. 13/099,169, Mar. 28, 2013, 12 pages.

"Non-Final Office Action", U.S. Appl. No. 13/429,090, Oct. 24, 2013, 13 pages.

"Non-Final Office Action", U.S. Appl. No. 12/484,563, Oct. 4, 2011, 13 pages.

"Non-Final Office Action", U.S. Appl. No. 12/732,036, Aug. 9, 2012, 13 pages.

"Non-Final Office Action", U.S. Appl. No. 13/479,124, Sep. 27, 2013, 14 pages.

"Non-Final Office Action", U.S. Appl. No. 12/646,721, Nov. 7, 2012, 15 pages.

"Non-Final Office Action", U.S. Appl. No. 12/646,721, May 10, 2012, 15 pages.

"Non-Final Office Action", U.S. Appl. No. 12/235,333, Jun. 28, 2011, 16 pages.

"Non-Final Office Action", U.S. Appl. No. 12/646,802, Mar. 29, 2012, 16 pages.

"Non-Final Office Action", U.S. Appl. No. 12/883,054, Nov. 22, 2013, 18 pages.

"Non-Final Office Action", U.S. Appl. No. 12/186,429, Apr. 25, 2011, 19 pages.

"Non-Final Office Action", U.S. Appl. No. 12/542,845, Apr. 4, 2012, 19 pages.

"Non-Final Office Action", U.S. Appl. No. 12/358,955, Sep. 6, 2011, 24 pages.

"Non-Final Office Action", U.S. Appl. No. 12/542,845, Oct. 23, 2013, 29 pages.

"Non-Final Office Action", U.S. Appl. No. 12/358,955, Aug. 20, 2012, 33 pages.

"Non-Final Office Action", U.S. Appl. No. 12/487,425, Jan. 12, 2012, 7 pages.

"Non-Final Office Action", U.S. Appl. No. 12/616,454, Dec. 22, 2011, 8 pages.

"Non-Final Office Action", U.S. Appl. No. 13/249,740, Mar. 26, 2013, 9 pages.

"Non-Final Office Action", U.S. Appl. No. 13/249,740, Oct. 16, 2013, 9 pages.

"Non-Final Office Action", U.S. Appl. No. 13/099,169, Oct. 4, 2013, 9 pages.

"Notice of Allowance", U.S. Appl. No. 12/167,841, Nov. 25, 2011, 11 pages.

"Notice of Allowance", U.S. Appl. No. 12/616,454, Aug. 22, 2012, 4 pages.

"Notice of Allowance", U.S. Appl. No. 12/235,333, Nov. 15, 2011, 5 pages.

"Notice of Allowance", U.S. Appl. No. 13/604,563, Sep. 26, 2013, 5 pages.

"Notice of Allowance", U.S. Appl. No. 12/484,563, Jul. 9, 2012, 6 pages.

"Notice of Allowance", U.S. Appl. No. 12/716,569, Apr. 19, 2012, 7 pages.

"Notice of Allowance", U.S. Appl. No. 12/732,036, Feb. 21, 2013, 8 pages.

"Notice of Allowance", U.S. Appl. No. 12/358,955, Jul. 1, 2013, 8 pages.

"Notice of Allowance", U.S. Appl. No. 13/656,482, Sep. 3, 2013, 8 pages.

"Notice of Allowance", U.S. Appl. No. 12/186,429, Jun. 6, 2013, 9 pages.

"Notice of Allowance", U.S. Appl. No. 12/487,425, Jul. 26, 2013, 9 pages.

"Part 11: Wireless LAN Medium Access Control (MAC) and Physical Layer (PHY) specifications", IEEE Std 802.11b-1999/Cor 1-2001,Amendment 2: Higher-speed Physical Layer (PHY) extension in the 2.4 GHz band, Nov. 7, 2001, 23 pages.

"Part 11: Wireless LAN Medium Access Control (MAC) and Physical Layer (PHY) specifications", IEEE Std 802.11a-1999,High-speed Physical Layer in the 5 GHz Band, 1999, 91 pages.

"PCT Search Report and Written Opinion", Application No. PCT/US2013/025144, Jun. 5, 2013, 10 pages.

"PCT Search Report and Written Opinion", Application No. PCT/US2011/054358, Dec. 16, 2011, 13 pages.

"PCT Search Report and Written Opinion", Application No. PCT/IB2013/000390, Aug. 21, 2013, 19 Pages.

(56) References Cited

OTHER PUBLICATIONS

"Restriction Requirement", U.S. Appl. No. 12/167,841, May 12, 2011, 6 pages.
"Supplemental Notice of Allowance", U.S. Appl. No. 12/186,429, Jul. 10, 2013, 2 pages.
"Supplemental Notice of Allowance", U.S. Appl. No. 12/323,292, Oct. 17, 2013, 2 pages.
"Supplemental Notice of Allowance", U.S. Appl. No. 12/323,292, Oct. 7, 2013, 2 pages.
"Supplemental Notice of Allowance", U.S. Appl. No. 12/716,569, Jul. 23, 2012, 2 pages.
"Supplemental Notice of Allowance", U.S. Appl. No. 12/358,955, Oct. 11, 2013, 3 pages.
Mujtaba "TGn Sync Proposal Technical Specification", IEEE 802.11-04/0889r6,This document presents the technical specification for the MAC and the PHY layer of the TGn Sync proposal to IEEE 802.11 TGn, May 18, 2005, pp. 1-131.
Mujtaba "TGn Sync Proposal Technical Specification", IEEE 802.11-04 / Wireless LANs, May 2005, pp. 1-131.
"Foreign Office Action", European Patent Application No. 09789754.0, Mar. 11, 2013, 4 Pages.
"Supplemental Notice of Allowance", U.S. Appl. No. 12/759,336, Jun. 5, 2013, 2 pages.
Jung, et al., "A Power Control MAC Protocol for Ad Hoc Networks", In Proceedings of MOBICOM 2002, Sep. 23, 2002, pp. 36-47.
"Advisory Action", U.S. Appl. No. 12/190,251, Dec. 7, 2011, 3 pages.
"Final Office Action", U.S. Appl. No. 12/759,336, Feb. 25, 2013, 11 pages.
"Final Office Action", U.S. Appl. No. 12/534,361, Feb. 29, 2012, 13 pages.
"Final Office Action", U.S. Appl. No. 12/190,251, Sep. 13, 2011, 15 pages.
"Final Office Action", U.S. Appl. No. 12/323,292, Aug. 24, 2012, 26 pages.
"Foreign Office Action", Chinese Application No. 200980122587.0, Feb. 21, 2013, 17 pages.
"Foreign Office Action", Japanese Application No. 2011-513586, Apr. 9, 2013, 4 Pages.
"Foreign Office Action", European Patent Application No. 09789754.0, Jul. 12, 2012, 4 pages.
"Foreign Office Action", Japanese Application No. 2011-513586, Oct. 23, 2012, 7 pages.
"Foreign Office Action", EP Application No. 09789754.0, May 17, 2011, 8 pages.
"Information Technology—Telecommunications and Information Exchange Between systems—Local and Metropolitan Area Networks—Specific Requirements", IEEE Standard, Aug. 1, 2005, pp. 1-60.
"Information Technology—Telecommunications and Information Exchange between Systems—Local and Metropolitan Area Networks—Specific Requirements", Part 11: Wireless LAN Medium Access Control (MAC) and Physical Layer (PHY) Specifications, IEEE Standard 802.11h-2003 (Amendment to IEEE Std 802.Nov. 1993), Oct. 14, 2003, 80 pages.
"Non-Final Office Action", U.S. Appl. No. 12/534,361, Oct. 12, 2011, 11 pages.
"Non-Final Office Action", U.S. Appl. No. 12/190,251, Mar. 29, 2012, 11 pages.
"Non-Final Office Action", U.S. Appl. No. 12/759,336, Oct. 4, 2012, 13 pages.
"Non-Final Office Action", U.S. Appl. No. 12/323,292, Dec. 21, 2011, 17 pages.
"Non-Final Office Action", U.S. Appl. No. 12/478,446, Dec. 28, 2011, 17 pages.
"Non-Final Office Action", U.S. Appl. No. 13/656,482, Mar. 19, 2013, 19 pages.
"Non-Final Office Action", U.S. Appl. No. 13/656,502, Feb. 21, 2013, 6 pages.
"Non-Final Office Action", U.S. Appl. No. 13/604,563, Apr. 5, 2013, 6 pages.
"Non-Final Office Action", U.S. Appl. No. 12/190,240, Jan. 6, 2012, 7 pages.
"Non-Final Office Action", U.S. Appl. No. 12/190,251, Mar. 29, 2011, 8 pages.
"Notice of Allowance", U.S. Appl. No. 12/534,361, Feb. 14, 2013, 12 pages.
"Notice of Allowance", U.S. Appl. No. 12/190,240, May 16, 2012, 4 pages.
"Notice of Allowance", U.S. Appl. No. 12/190,251, Oct. 4, 2012, 6 pages.
"Notice of Allowance", U.S. Appl. No. 12/478,446, Jun. 14, 2012, 6 pages.
"Notice of Allowance", U.S. Appl. No. 12/759,336, May 3, 2013, 9 pages.
"Part 11: Wireless LAN Medium Access Control (MAC) and Physical Layer (PHY) specifications", Information technology—Telecommunications and information exchange between systems—Local and metropolitan area networks—Specific requirements—,IEEE, Apr. 2003, pp. 1-69.
"PCT Search Report", Application No. PCT/US2009/046289, Oct. 29, 2009, 13 pages.
Jung, et al.,"A Power Control MAC Protocol for Ad Hoc Networks", Wireless Networks ; The Journal of Mobile Communication, Computation and Information, Kluwer Academic Publishers vol. 11, No. 1-2, Jan. 1, 2005, 12 Pages.
"Foreign Notice of Allowance", Japanese Application No. 2011-513586, Jul. 16, 2013, 2 pages.
Qiao, et al.,"Interference Analysis and Transmit Power Control in IEEE 802.11a/h Wireless LANs", IEEE / ACM Transactions on Networking, IEEE / ACM, New York, NY, US, vol. 15. No. 5, Oct. 1, 2007, 14 Pages.
"Notice of Allowance", U.S. Appl. No. 13/656,502, Jun. 25, 2013, 11 pages.
"Notice of Allowance", U.S. Appl. No. 12/323,292, Jun. 28, 2013, 8 pages.
Tinnirello, et al.,"Revisit of RTS / CTS Exchange in High-Speed IEEE 802.11 Networks", World of Wireless Mobile and Multimedia Networks. 2005. Wowmom 2005. Sixth IEEE International Symposium on a Taormina-Giardini Naxos, Italy Jun. 13-16, 2005 Piscataway, NJ, USA,IEEE, Los Alamitos, CA, USA, Jun. 13, 2005, 10 Pages.
"Search Report", European Application No. 13169350.9, Aug. 13, 2013, 10 Pages.
"Supplemental Notice of Allowance", U.S. Appl. No. 12/759,336, Jun. 18, 2013, 2 pages.
"Supplemental Notice of Allowance", U.S. Appl. No. 12/759,336, Aug. 14, 2013, 2 pages.
"Foreign Office Action", CN Application No. 200980122587.0, Jan. 24, 2014, 10 Pages.
"Non-Final Office Action", U.S. Appl. No. 13/911,979, Jan. 31, 2014, 19 pages.
"Supplemental Notice of Allowance", U.S. Appl. No. 13/656,482, Nov. 29, 2013, 2 pages.
"Supplemental Notice of Allowance", U.S. Appl. No. 13/656,482, Dec. 19, 2013, 2 pages.
"Final Office Action", U.S. Appl. No. 12/883,054, Jun. 9, 2014, 22 pages.
"Foreign Office Action", EP Application No. 13169350.9, May 9, 2014, 3 Pages.
"Non-Final Office Action", U.S. Appl. No. 13/458,227, Jul. 3, 2014, 10 pages.
"Non-Final Office Action", U.S. Appl. No. 13/536,506, Apr. 25, 2014, 12 pages.
"Non-Final Office Action", U.S. Appl. No. 13/911,979, Jun. 9, 2014, 11 pages.
"Non-Final Office Action", U.S. Appl. No. 14/089,515, May 13, 2014, 9 pages.
"Foreign Office Action", CN Application No. 200980122587.0, Jul. 3, 2014, 12 Pages.

(56) References Cited

OTHER PUBLICATIONS

"Non-Final Office Action", U.S. Appl. No. 12/883,054, Sep. 11, 2014, 29 pages.
"Non-Final Office Action", U.S. Appl. No. 13/622,916, Sep. 10, 2014, 10 pages.
"Non-Final Office Action", U.S. Appl. No. 14/018,232, Aug. 13, 2014, 6 pages.
"Non-Final Office Action", U.S. Appl. No. 14/063,972, Sep. 24, 2014, 6 pages.
"Non-Final Office Action", U.S. Appl. No. 14/082,981, Aug. 4, 2014, 6 pages.
"Notice of Allowance", U.S. Appl. No. 13/536,506, Sep. 19, 2014, 7 pages.
"Notice of Allowance", U.S. Appl. No. 14/089,515, Aug. 21, 2014, 4 pages.

* cited by examiner

BLUETOOTH WIDEBAND SCAN MODE

RELATED APPLICATION

This application claims priority to U.S. Utility application Ser. No. 12/190,251, filed on Aug. 12, 2008 which in turn claims priority to U.S. Provisional Application No. 60/955,497, filed on Aug. 13, 2007, the disclosure of which is incorporated by reference herein.

BACKGROUND

Bluetooth technology allows Bluetooth devices to discover one another when they are within range and then to connect to one another. Discovery and subsequent connection to another Bluetooth device occurs through inquiry and page scan operations. The purpose of the inquiry operation is to discover other Bluetooth devices; and, the purpose of the page scan operation is to connect to other Bluetooth devices.

In operation, a first Bluetooth device, termed a "master", acts as an inquirer by transmitting short packets at a very fast rate. A second device, termed a "slave", listens for those packets by conducting an inquiry scan at a much slower rate. During this process, channel hopping is employed, as will be appreciated by the skilled artisan, so that eventually the devices will synchronize up with one another.

One of the problems associated with the discovery process is that during the time when the slave device listens for packets in its inquiry scan, the slave device is in a full receive state or mode, meaning that current draw and power consumption are high. This problem can be particularly challenging in the context of battery-powered devices.

SUMMARY

This Summary is provided to introduce subject matter that is further described below in the Detailed Description and Drawings. Accordingly, the Summary should not be considered to describe essential features nor used to limit the scope of the claimed subject matter.

In one embodiment, a method comprises initiating a wideband scan mode in a Bluetooth slave device, wherein the wideband scan mode is one other than a full receive mode; receiving a signal from a Bluetooth master device; ascertaining whether an energy pattern for multiple channels with respect to the received signal is detected; and if the energy pattern is detected, entering the full receive mode.

In another embodiment, a Bluetooth device comprising circuitry configured to: initiate a wideband scan mode, wherein the wideband scan mode is one other than a full receive mode; receive a signal from a Bluetooth master device; ascertain whether an energy pattern for multiple channels with respect to the received signal is detected; and if the energy pattern is detected, enter the full receive mode.

In another embodiment, a system comprises means for initiating a wideband scan mode in a Bluetooth slave device, wherein the wideband scan mode is one other than a full receive mode; means for receiving a signal from a Bluetooth master device; means for ascertaining whether an energy pattern for multiple channels with respect to the received signal is detected; and means for entering the full receive mode if the energy pattern is detected.

BRIEF DESCRIPTION OF THE DRAWINGS

The same numbers are used throughout the drawings to reference like features.

DETAILED DESCRIPTION

Overview

In various embodiments, different scan modes are provided for Bluetooth devices. In at least some embodiments, a narrowband scanning mode is employed that looks for signal energy on individual transmission frequencies at a time. By looking for signal energy rather than decoding transmitted packets, at least some of the components in a Bluetooth device can remain in an idle or rest state. In at least some other embodiments, a midband scanning mode is employed and looks for signal energy across multiple different frequencies at a time. By looking for signal energy across multiple different frequencies rather than decoding transmitted packets, at least some of the components in a Bluetooth device can remain in an idle or rest state. In at least some other embodiments, a wideband scanning mode is employed and looks for signal energies across all relevant frequencies at a time. Further, at least some embodiments enable a Bluetooth device to switch between scanning modes as will become apparent below.

In the discussion that follows, a section entitled "Operating Environment" is provided and describes one example operating environment in which one or more embodiments can be employed. Following this, a section entitled "Narrowband Mode" is provided and describes an embodiment that employs a narrowband scanning mode in a Bluetooth device. Following this, a section entitled "Midband Mode" is provided and describes an embodiment that employs a midband scanning mode. Next, a section entitled "Wideband Mode" is provided and describes an embodiment that employs a wideband scanning mode. Following this section, a section entitled "Switching between Modes" is provided and describes embodiments that enable a Bluetooth device to switch between various scanning modes.

Operating Environment

Figure 1:
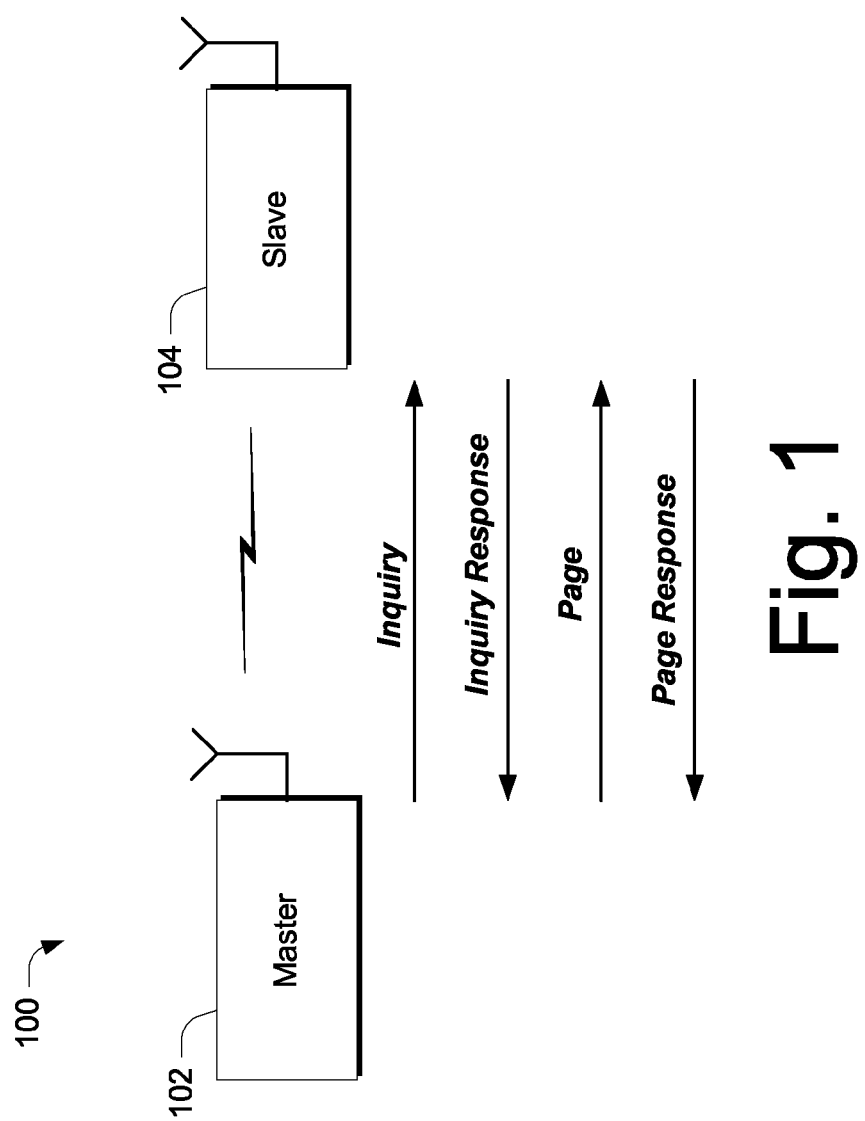
FIG. 1 depicts an example operating environment in accordance with one or more embodiments.

FIG. 1 depicts an example operating environment in accordance with one or more embodiments, generally at 100. In this particular example, the operating environment includes a master device 102 and a slave device 104, referred to herein as "Bluetooth devices". In some instances, the operating environment can include multiple master devices and multiple slave devices. However, for purposes of simplicity and brevity, only one of each type of device is shown.

As will be appreciated by the skilled artisan, the master and slave devices can be embodied as any suitable digital device including, by way of example and not limitation, telephones, laptop computer systems, head sets, printers, personal digital assistants, desktop computer systems, fax machines, keyboards, joy sticks, and virtually any other type of digital device. Typically, such devices include a Bluetooth transceiver to both transmit and receive signals.

In operation, a device discovery process is used by master device 102 to discover one or more slave devices such as slave device 104. Initially, master device 102 sends or broadcasts a general inquiry message or inquiry that can be received by slave device 104. When the master device 102 broadcasts an inquiry, it typically remains in an inquiry state for a predetermined period of time which may be programmable. If a slave device, such as slave device 104, is in a discoverable state, the slave device enters into an inquiry scan during which time it scans for inquiries for a predetermined period of time. The slave device 104 can then send an inquiry response to the master device 102. The inquiry response can provide information such as a Bluetooth device address for the master device 102 to use for connecting to the slave device 104.

To connect to a slave device, a master device then sends a page to the slave device that responded to its inquiry. In response to a page, the slave device sends a page response that provides information that enables the master device to display a user-friendly name for a user to select for connection to the slave device.

In a normal page scan operation, the master device 102 hops frequencies at 3200 hops per second over 32 channels. The master device typically transmits an ID packet having a duration of 68 µs every 312.5 µs. Typically, the 32 channels are split into two trains of 16 sub-channels. The master device steps through a train in 10 ms and then repeats the trains in a certain pattern for a programmable duration such as, for example, 5.12 seconds or 10.24 seconds. The master device operates in a repeated pattern, for example, transmit-transmit-receive-receive pattern until the slave device responds or times out.

The slave device 104 typically opens a scan window having a duration of 11.25 ms every 1.28 seconds, both durations of which are programmable. During this time, the slave device dwells at different channels at every scan window. The slave device responds once an ID packet has been detected and follows using the remaining connection set up protocol. For a 5.12 second master paging duration, there are typically four chances for the slave device to detect the ID packet from the master device.

Figure 2:
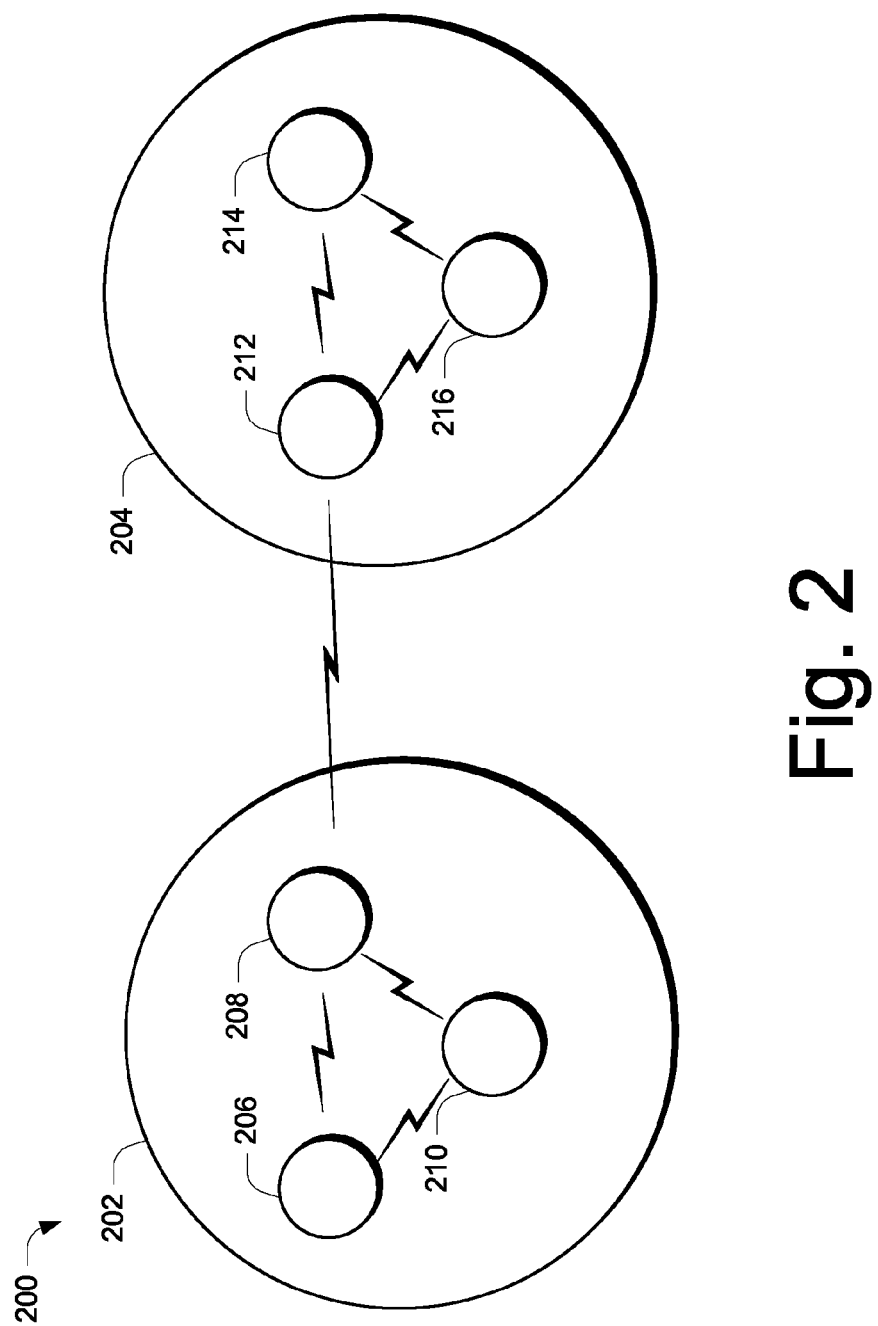
FIG. 2 illustrates a typical topology of a network of devices that are communicatively linked using wireless connections in accordance with Bluetooth technology.

FIG. 2 illustrates a typical topology of a network 200 of devices that are communicatively linked using wireless connections in accordance with Bluetooth technology. In this example, a piconet 202 includes devices 206, 208, and 210 that are wirelessly, communicatively linked. Likewise, a piconet 204 includes devices 212, 214, and 216 that are wirelessly, communicatively linked. Further, piconets 202, 204 are wirelessly, communicatively linked by virtue of a link between devices 208 and 212. As noted above, the illustrated devices can comprise any suitable type of device.

Figure 3:
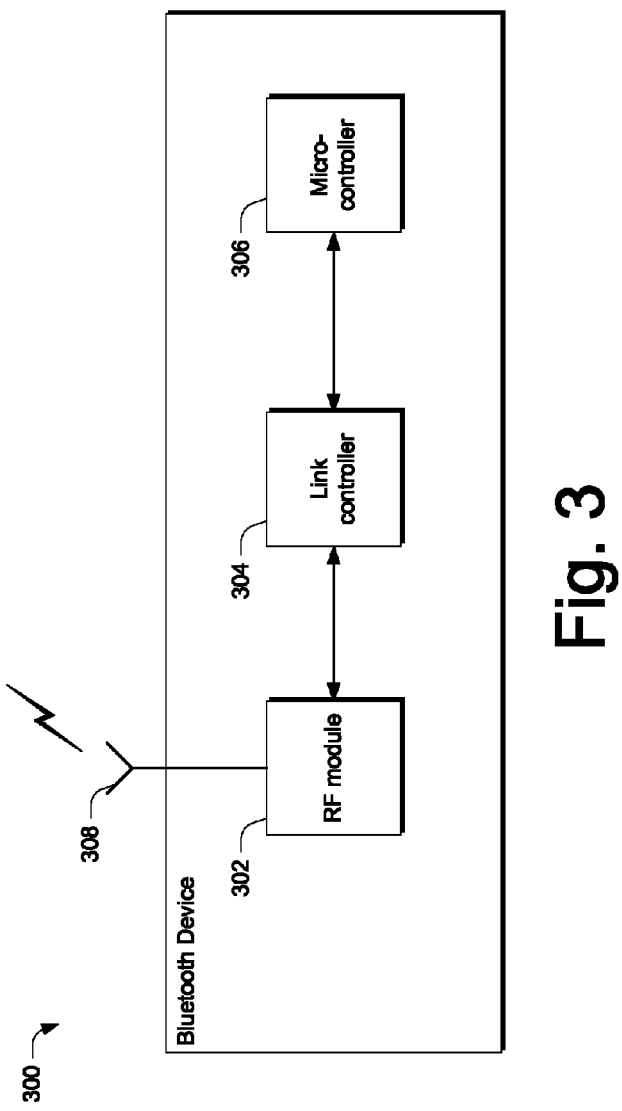
FIG. 3 illustrates a block diagram of a Bluetooth device.

FIG. 3 illustrates a block diagram of a Bluetooth device generally at 300. In this example, Bluetooth device 300 includes an RF module 302, a link controller 304, and a microcontroller 306. In addition, an antenna 308 is operatively coupled with the RF module 302.

Antenna 308 transmits and receives radio signals that are processed by RF module 302. The RF module comprises a Bluetooth radio which provides various functionality including, by way of example and not limitation, bridging to data networks and forming piconets of connected devices. The Bluetooth radio operates in accordance with the Bluetooth standard BT2.1. Link controller 304 is embodied as a hardware digital signal processor for performing, among other processing, various baseband processing operations. Microcontroller 306 provides a separate central processing unit for managing the Bluetooth device and for handling inquiries and requests. The microcontroller can be used to discover and communicate with other Bluetooth devices via a Link Manager Protocol or LMP. The Link Manager Protocol provides services including, by way of example and not limitation, sending and receiving data, inquiring and reporting names or device identifiers, making and responding to link address inquiries, connection set up, authentication, and link mode negotiation and set up.

Having considered an example operating environment and some background principles on Bluetooth operation, consider now a discussion of various power-saving scanning modes in accordance with one or more embodiments.

Narrowband Mode

In one or more embodiments, a narrowband scanning mode is utilized to look for energy on a particular frequency. In at least some embodiments, the narrowband scanning mode does not utilize a full Bluetooth receive state, and hence full current consumption during the scan period. Instead, a substate is entered during which time the Bluetooth device does not attempt to decode a packet. Rather, the Bluetooth device looks for energy on a frequency and, responsive to finding energy on a frequency that fits a particular profile, a decision is made that a corresponding signal is a legitimate Bluetooth transmission.

With a scanning device, such as a Bluetooth slave device, one typically wants the device to be discoverable at all times. However, one does not necessarily know that there is another device, such as a master device, attempting to discover the slave device.

In accordance with one or more embodiments, when an energy detection scan is conducted, only the transceiver and a couple other components are in an operational state. This serves to conserve power and hence constitutes an operating efficiency. One of the advantages of using a narrowband scan is that the same system architecture can be used for the transceiver as well as other components on the device. Another of the advantages of using narrowband scanning is that adverse impacts due to interference can be reduced. One trade-off, however, is that compared to other scanning modes described below, there can be a higher current consumption. In some implementations, the current estimation for current consumption in the narrowband embodiment is about 20 milliamps.

Figure 4:
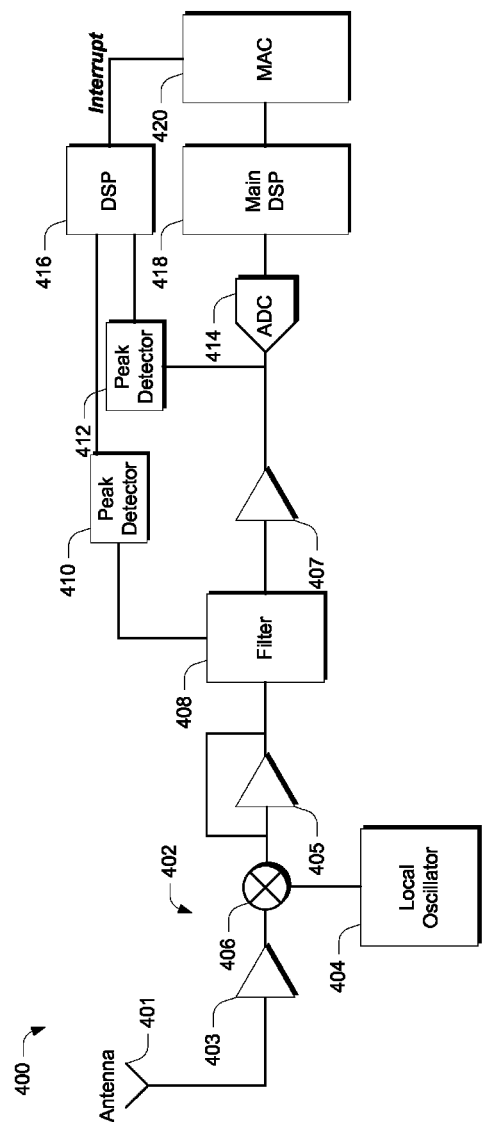
FIG. 4 illustrates an example electrical circuit that can be used in accordance with one or more embodiments.

FIG. 4 illustrates an example electrical circuit that can be used in accordance with one or more embodiments generally at 400. The electrical circuit is incorporated in the receiver portion of a Bluetooth system. In this example, the electrical circuit comprises an antenna 401 connected through an amplifier 403 to a mixing/downconverting circuit 402 that includes a local oscillator 404 and a mixer 406. In one or more embodiments, the local oscillator 404 employs a closed loop phase lock loop. The mixing/downconverting circuit 402 is connected through a feedback amplifier 405 to a filter 408. Filter 408 is operably connected to a peak detector 410 and, through an amplifier 407 to analog-to-digital converter 414. A second peak detector 412 is provided and receives as input the output of the amplifier connecting filter 408 and analog-to-digital converter 414. The output of peak detectors 410, 412 is provided to a digital signal processor 416 whose output constitutes an interrupt signal that is provided to medium access control component or MAC 420. The output of analog-to-digital converter 414 is provided as input to a main digital signal processor 418.

In operation, a signal is received by the antenna and down converted by mixing/down converting circuit 402 to a frequency of 2 MHz with a bandwidth of 1 MHz. The energy of the received signal is detected by the peak detectors 410, 412 and analyzed by DSP 416. If a duration threshold that is set for the energy is reached, then the DSP 416 knows that the signal constitutes a Bluetooth package and not some other signal such as WIFI or microwave signal. If such is the case, DSP 416 generates an interrupt signal which is provided to MAC 420 effectively waking the MAC and other components up to operate in a normal receive mode in which packets can be decoded.

In the illustrated and described embodiment, at least some of the components of electrical circuit 400 are not turned on or operational during energy detection operations. These include analog-to-digital converter 414, main DSP 418, and MAC 420. Specifically, these components do not need to be continuously on. Rather, they are on for only a short period of time (such as during packet decoding) and are idle otherwise. Most of the time, this circuit operates in a low power mode, by virtue of a number of the components being idle. Only upon an energy detection meeting a defined threshold is normal operation assumed.

In operation, the peak detectors are implemented as window threshold detection circuits. In the particular design, there are two thresholds—a high threshold associated with one of the peak detectors, and a low threshold associated with the other of the peak detectors. Window peak detection utilizes both the high and low thresholds. The peak detectors also employ a common mode voltage between the high and low thresholds. When a signal is received that crosses the high and low thresholds, the peak detectors are triggered and a peak will be generated. Based on this peak generation detected by DSP 416, the interrupt signal is generated and provided to MAC 420.

Describing this operation from a somewhat higher level, consider the following. The default or normal operation of the scanning or slave device is to typically conduct a page and inquiry operation back-to-back, each of which lasts around 11 ms, with a page and inquiry operation being repeated typically every 1.28 seconds. Normally, the device is not necessarily expecting any data at any particular time, but it is ready for data. Each page and inquiry operation constitutes a scan window and the time associated with a page and inquiry operation scan window is referred to as a scan interval. In the typical Bluetooth device, a full receive mode is entered on a scan window during which time the device looks for a correlation hit which triggers a response. In the full receive mode, all of the components in FIG. 4 would be operational. In the illustrated and described embodiment, however, instead of entering a full receive mode on a scan window, a narrowband scan is performed on a channel that would have been in the normal sequence. In this case, when an energy detection event occurs, as detected by the peak detectors 410, 412, a normal page scan operation is performed. The normal page scan operation can be conducted sometime later because the master device repeats the transmission process for a set period of time, e.g. five seconds, during which time the slave device can synchronize to the channel on which transmission occurs.

For example, every 10 ms the master device repeats 16 channels which is going to be done 128 times. When an energy detection event occurs on a channel, a full receive mode is conducted to do a full scan. Around 10 ms later, the master device should be on the same channel. As will be appreciated by the skilled artisan, Bluetooth employs 79 channels but for the inquiry and page operations, it uses a subset of 32 channels. For an inquiry operation, the 32 channels are fixed, but for a page operation, the 32 channels depend on the master device's Bluetooth address. The 32 channels are taken and broken into two trains, each having 16 channels.

In the illustrated and described embodiment, the energy detection operation is specific to each channel. In the narrowband mode, the Bluetooth baseband notifies the Bluetooth analog radio and the DSP 416 on which channel to conduct the narrowband detection operation. If energy is detected on a particular channel, the Bluetooth baseband will initiate a full receive mode on that channel using MAC 420 and the other components that were idle. During every scan interval, the scanning or slave device changes its channel, but it does this very slowly, e.g. every 1.28 seconds. At same time, the master device transmits on these channels very quickly. Thus, the master device repeats transmissions enough that there is a very good chance that the signals or channels will line up on both devices.

Figure 5:
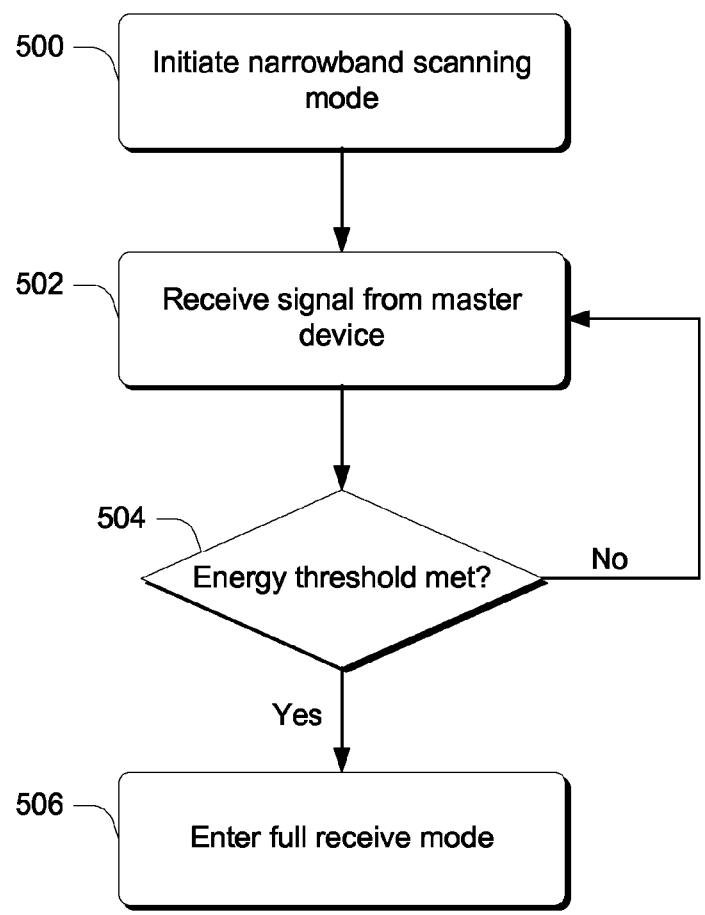
FIG. 5 is a flow diagram that describes steps in a method in accordance with one or more embodiments.

FIG. 5 is a flow diagram that describes steps in a method in accordance with one or more embodiments. The method can be performed in connection with any suitable hardware, software, firmware, or combination thereof. In one or more embodiments, the method is performed by a suitably-configured Bluetooth slave device.

Step 500 initiates a narrowband scanning mode. An example of a narrowband scanning mode is provided above. Step 502 receives a signal from a master device. Step 504 ascertains whether the signal energy with respect to the received signal meets a defined threshold. The step is performed in the narrowband scanning mode on a channel by channel basis. If the received signal on a particular channel does not meet the energy threshold, the method returns to 502. If, on the other hand, the received signal on the particular channel does meet the energy threshold, step 506 enters a full receive mode. In the illustrated and described embodiment, when a full receive mode is entered, an interrupt signal is generated to wake up components that were otherwise in an idle state on the slave device. In the example above, components that are awakened include, by way of example and not limitation, MAC 420, main DSP 418, and analog-to-digital converter 414 (FIG. 4).

Midband Mode

In one or more embodiments, a midband scanning mode can be employed to listen to multiple channels at a time rather than to a single channel at a time, as in the narrowband mode. Any suitable number of channels can be used in the midband scanning mode. In the example below, five channels are used at a time. It is to be appreciated and understood that any number of multiple channels can be used without departing from the spirit and scope of the claimed subject matter.

Figure 6:
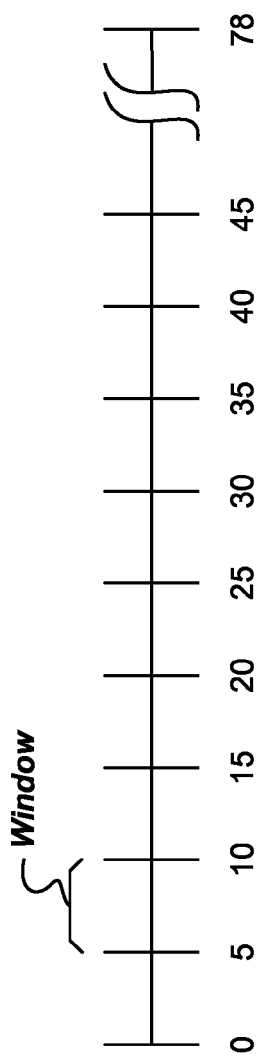
FIG. 6 is a diagram that depicts multiple Bluetooth channels in accordance with one or more embodiments.

As an example, consider the following in connection with FIG. 6. Assume the normal 79 Bluetooth channels as shown. In the normal receive mode, the Bluetooth slave device typically remains in one channel for 1.28 seconds and then changes to the next channel. During this time, the master device hops through these channel sequences at a much faster rate. Accordingly, if the slave device remains at one channel for a period of time, the master device is going to hop through the channels very quickly and the slave should be able to detect a transmission on the one channel. In the present embodiment, the bandwidth is opened to 5 MHz so that the slave device performs an energy detection on five channels at a time. So, if the effective listening channel ranges between channels 5-10, as in the Figure, if the master device hops to any of these channels, the slave device should be able to detect this. In this particular example, the circuit of FIG. 4 can be employed with a slight modification. Specifically, instead of using a closed loop phase lock loop in the local oscillator 404, an open loop phase lock loop is employed.

Figure 7:
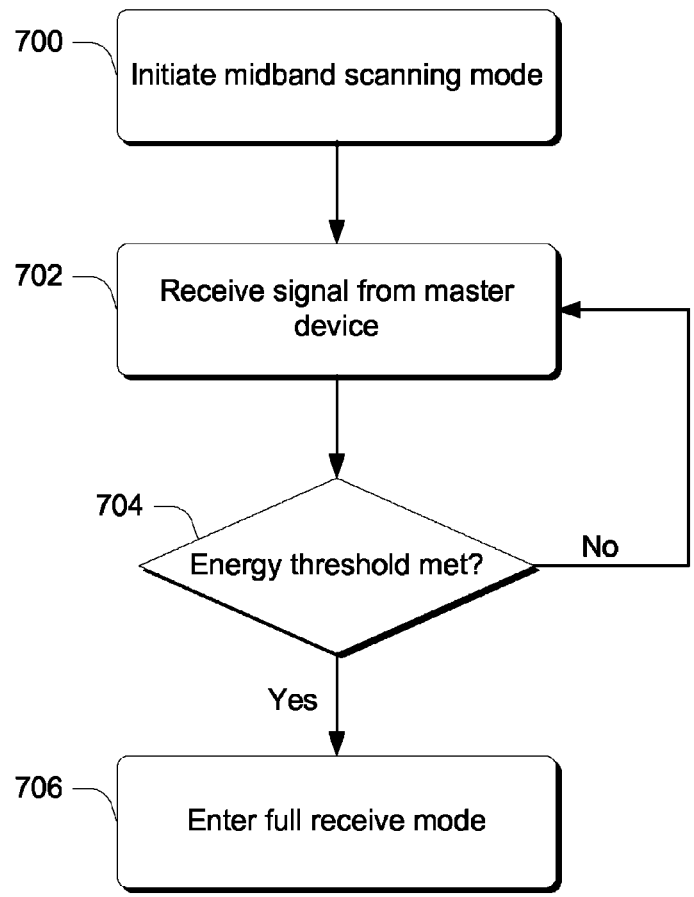
FIG. 7 is a flow diagram that describes steps in a method in accordance with one or more embodiments.

FIG. 7 is a flow diagram that describes steps in a method in accordance with one or more embodiments. The method can be performed in connection with any suitable hardware, software, firmware, or combination thereof. In one or more embodiments, the method is performed by a suitably-configured Bluetooth slave device.

Step 700 initiates a midband scanning mode. An example of a midband scanning mode is provided above. Step 702 receives a signal from a master device. Step 704 ascertains whether a signal energy for multiple channels with respect to the received signal meets a defined threshold. The step is performed in the midband scanning mode on a multiple channel by multiple channel basis. As noted above, any suitable number of multiple channels can be used. If the received signal on a collection of channels does not meet the energy threshold, the method returns to 702. If, on the other hand, the received signal on the multiple channels does meet the energy threshold, step 706 enters a full receive mode. In the illustrated and described embodiment, when a full receive mode is entered, an interrupt signal is generated to wake up components that were otherwise in an idle state on the slave device. In the example above, components that are awakened include, by way of example and not limitation, MAC 22, main DSP 24, and analog-to-digital converter 26 (FIG. 4).

Wideband Mode

In one or more embodiments, a wideband scanning mode can be employed to listen to all of the channels simultaneously rather than to individual channels or a sub-set of channels, as in the narrowband and midband scanning modes respectively.

One of the challenges of using the wideband scanning mode stems from noise that might be present within the range of channels which cannot be differentiated in terms of the channel or channels on which the noise occurs. An advantage of the wideband scanning mode, however, is that the pattern created by an inquiring or paging device (i.e. master device) is very distinct and very repetitive and is going to repeat multiple times in the period of one of the scan windows. So, in this case, the slave device looks for energy with a pattern that is distinct rather than a spike, as in the narrowband scanning mode.

Figure 8:
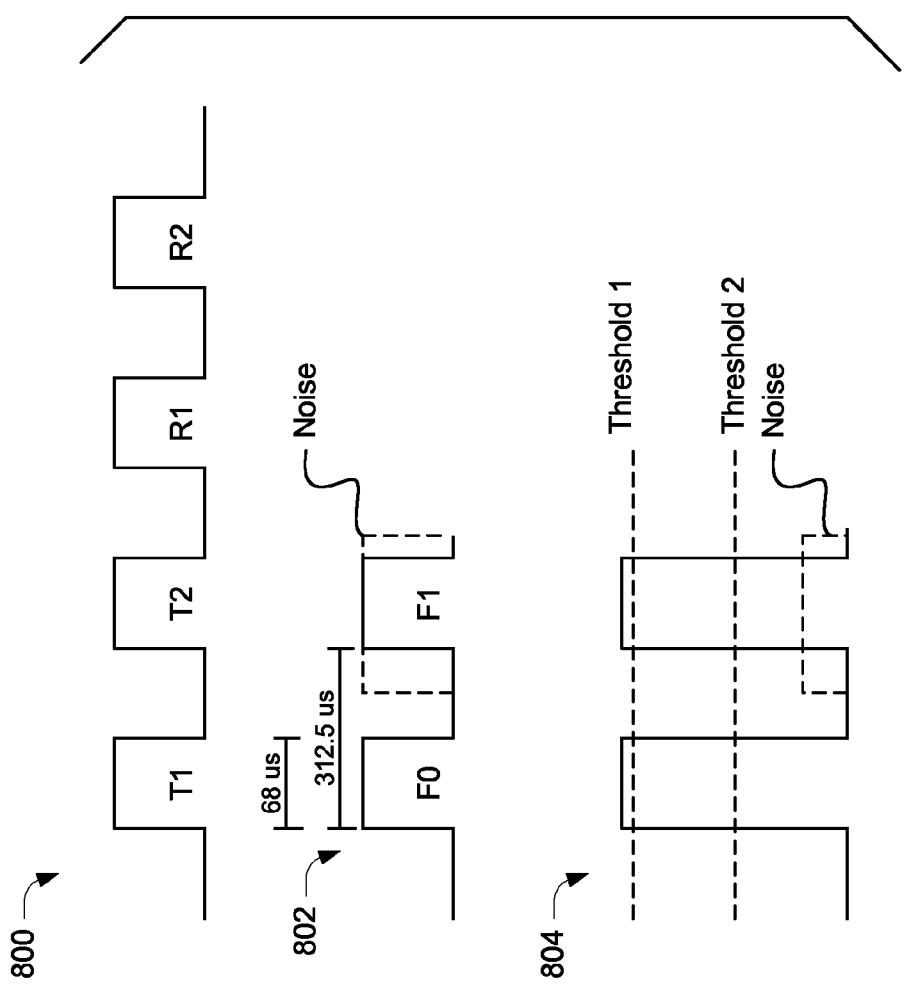
FIG. 8 is a diagram that depicts Bluetooth transmissions in accordance with one or more embodiments.

As an example, consider FIG. 8. Typically, as shown at 800, the inquiring or master device transmits first at T1 on a first channel and then transmits again at T2 on a second different channel. It then listens for a response as indicated by R1 and R2. R1 and R2 correspond to the same channel on which the transmissions occur, e.g. T1 and T2 respectively. The master device typically performs this operation repeatedly for a predetermined period of time—e.g., for a minimum of five seconds. In the period of a scan window on the slave device, there are going to be 16 transmits on 16 different frequencies.

In the illustrated and described embodiment, the slave device employs a filter that looks for this particular pattern and it provides a baseband indication of how closely a match the energy of the received transmission is to this pattern. When a match occurs, a full scan is triggered and the slave device enters a full receive mode, as in the above example.

One advantage of this approach is that because the pattern is repeating, it is unique. Specifically, in at least some embodiments, the transmission pattern can be characterized by a profile that is a regular and recognizable profile. For example, each transmission, e.g. T1 and T2, lasts for 68 μs and there is a separation of 312.5 μs. Accordingly, the slave device looks for this pattern, as indicated at 802. Accordingly, the slave device attempts to detect energy that fits this pattern in terms of a qualified width of the energy (e.g., 68 μs) with a separation of 312.5 μs between energy detections, over a period of time that includes multiple transmissions on the same frequency.

Thus, in this example, if the slave device looks at a window of 1250 μs, the above pattern is going to repeat over and over. If the slave device is in a clean environment, which is to say an environment that is free from noise, the slave device should detect the precisely-transmitted waveform in terms of its energy. If, however, there is some noise in the environment such as that caused by other devices, the slave device will see this noise as indicated by the dashed lines in 802. In operation, data transmission information is collected over a programmable period time, such as either during a full frame or a portion of a frame, such as half of a frame. Over time, during the master device's multiple transmissions, the slave device can build a histogram such as that shown at 804. For example, in at least some embodiments, to construct a histogram over the 1250 μs, multiple samples are taken every 32 μs. Each sample is stored into a memory element or accumulator. For the next 1250 μs, samples are taken and stored back into the accumulator to correspond to the previous samples at locations in the previous 1250 μs window.

The illustrated histogram constitutes a clean histogram in a clean environment. However, if there is interference or noise, the histogram may contain noise data, such as that shown by the dashed line labeled "Noise". In one or more embodiments, to deal with the noise issue, different thresholds can be programmed and set to look for energy peaks in the histogram, the width of the peaks and the distance between the peaks, such as 68 μs and 312.5 μs, respectively. For example, a first threshold such as Threshold 1 can be set to look for energy peaks, and a second threshold such as Threshold 2 can be set to recognize noise. Based on this programmability in terms of threshold setting, if there is a close match of the pattern that is being looked for, the slave device can conclude that this is a desirable pattern that corresponds to a master device making an inquiry. From this information, the slave device can generate an interrupt signal to the overall system which wakes up idling components. Responsively, the slave device can then decode the next transmitted packet and ascertain whether a response is to be sent to the master device. In at least some embodiments, if there is some noise in the histogram, then the slave device may enter a different scanning mode, such as the narrowband or midband scanning modes to deal more appropriately with the noise, as described below.

Programmability provides an opportunity to look at a programmable number of iterations. Accordingly, the slave device can look for patterns that are repeated a number of times and make a decision to generate an interrupt signal based on a recognized pattern. Alternately or additionally, if the slave device is a clean environment, the scan window can be shrunk and then any indication of energy can be used to go into a regular scan or receive mode. This provides the ability for aggressive power management in clean environments. That is, as the slave device encounters a noisy environment, through programmability, the length of the scan window can be increased as well as the pattern requirements adapted to suit the environment.

Figure 9:
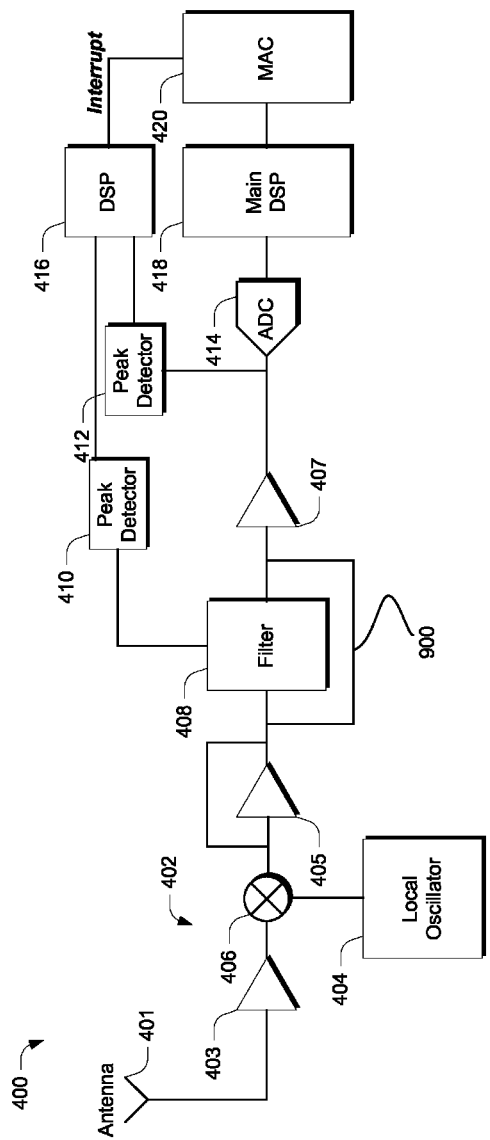
FIG. 9 illustrates an electrical circuit that can be used in a wideband mode in accordance with one or more embodiments.

FIG. 9 illustrates an electrical circuit that can be used in the wideband mode in accordance with one or more embodiments. In this example, the circuit is similar to that shown in FIG. 4. Accordingly, for the sake of brevity, like components use like numerals and the description of such components is not repeated here. In the wideband implementation, an open loop voltage controlled oscillator or VCO is used for local oscillator 404. In the wideband mode, filter 408 is shutoff and bypassed by a bypass 900 as shown. In this case, peak detector 412 is used for energy detection. In this case, instead of setting the local oscillator frequency to either upper or lower values of the channels, the oscillator frequency is set to mid-channel. Setting the frequency to mid-channel enables 80 MHz to be captured collectively with 40 MHz on each side of the frequency setting. In terms of power savings, there is an advantage at the system level because previously, in the narrowband and midband modes, the MAC 420 or Bluetooth baseband would wake up, calculate the channel, and then perform timing operations as will be appreciated by the skilled artisan. In this system, however, since the channel is not programmed, the MAC 420 does not have to wake up to program any channels during energy detection.

Figure 10:
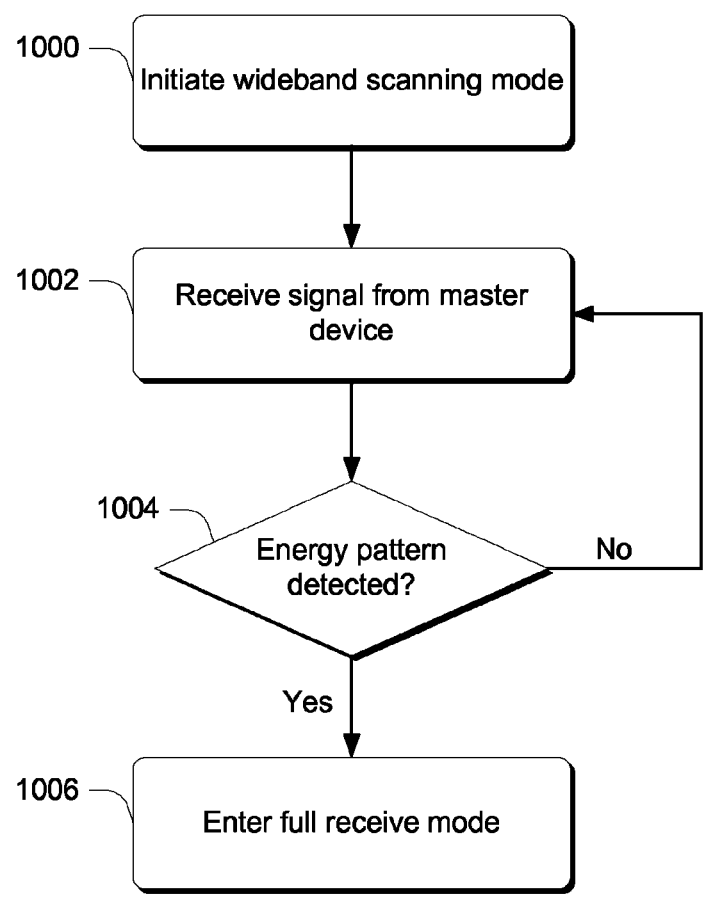
FIG. 10 is a flow diagram that describes steps in a method in accordance with one or more embodiments.

FIG. 10 is a flow diagram that describes steps in a method in accordance with one or more embodiments. The method can be performed in connection with any suitable hardware, software, firmware, or combination thereof. In one or more embodiments, the method is performed by a suitably-configured Bluetooth slave device.

Step 1000 initiates a wideband scanning mode. An example of a wideband scanning mode is provided above. Step 1002 receives a signal from a master device. Step 1004 ascertains whether an energy pattern for multiple channels with respect to the received signal is detected. The step can be performed by building a histogram over the received transmissions and then ascertaining from the histogram whether the energy pattern is detected. As noted above, one or more thresholds can be set to look for not only the desired energy pattern, but for noise as well. If the energy pattern is not detected, the method returns to 1002. If, on the other hand, the energy pattern is detected, step 1006 enters a full receive mode. In the illustrated and described embodiment, when a full receive mode is entered, an interrupt signal is generated to wake up components that were otherwise in an idle state on the slave device. In the example above, components that are awakened include, by way of example and not limitation, MAC 420, main DSP 418, and analog-to-digital converter 414 (FIG. 4).

Switching Between Modes

As noted above, in at least some embodiments, the slave device is configured to switch between different scanning modes.

In one or more embodiments, the slave device initiates operation in its lowest power mode—here, the wideband scanning mode. The slave device performs wideband detection at pre-determined intervals which can be sustained for an indefinite period of time. Eventually, another device may be within the slave device's reception area and begin transmissions at which time the slave device will see some type of energy detection. When this happens, in at least some embodiments, the slave device may wish to enter into another scanning mode to ascertain whether the transmissions are from another Bluetooth device or whether the transmission constitute some type of noise.

In the simplest case, the slave device can enter, from the wideband scanning mode, a regular scanning mode. Thus, when an energy pattern is detected, a programmable period of regular scanning can be started. For example, the slave device might perform four regular scans as four scans correspond to the typical length of an inquiry or a page from the master device. During a regular scan, the MAC or Bluetooth baseband will wake up and perform a scan during the programmable period. When this is completed, the slave device will have either found a desirable signal or not. If it does not find a desirable signal, these components can go idle and the wideband mode can be entered. In addition, a false detection can be noted and stored. Specifically, in some embodiments, a counter can keep track of the number of false detections. If the false detections reach a particular threshold, the system can fall back into a different mode, such as narrowband scanning mode, in which the slave device attempts to qualify whether a transmission is really a Bluetooth device by narrowing down onto one or more channels. If there is an energy detection in this mode, the slave device can enter into a regular scan mode. If, in the regular scan mode, nothing is detected, a false detection can be noted.

In one or more embodiments, in order to conserve power, one goal is to remain in the wideband scanning mode as long as possible. When an energy detection occurs, the slave device falls back into a different scanning mode, such as a narrowband, midband or regular scanning mode to attempt to scope down on the signal for a set period of time. This can be advantageous for the following reason. Assume that the slave device is in a noisy environment where the wideband mode would be triggering regularly. In a worst case scenario, the slave device would switch into a regular scanning mode, although other modes are possible.

In at least some embodiments, however, the slave device can keep track the type of energy detection that occurs. For example, if the energy detection is a strong detection, then the slave device might switch into a regular scanning mode. If, on the other hand, the energy detection is a weak detection, the slave device might switch into the narrowband or midband modes.

Figure 11:
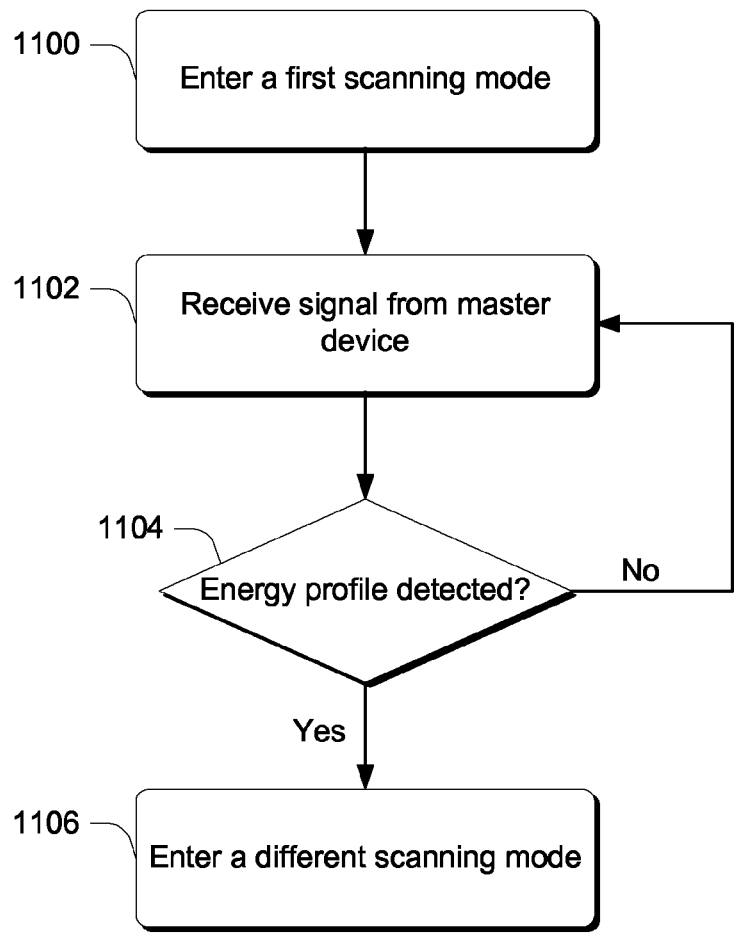
FIG. 11 is a flow diagram that describes steps in a method in accordance with one or more embodiments.

FIG. 11 is a flow diagram that describes steps in a method in accordance with one or more embodiments. The method can be performed in connection with any suitable hardware, software, firmware, or combination thereof. In one or more embodiments, the method is performed by a suitably-configured Bluetooth slave device.

Step 1100 enters a first scanning mode. Any suitable scanning mode can be entered. For example, in the illustration above, the first scanning mode constitutes a wideband scanning mode. An example of a wideband scanning mode is provided above. Step 1102 receives a signal from a master device. Step 1104 ascertains whether an energy profile is detected. The energy profile can be a profile associated with one or multiple channels. For example, an energy profile can be associated with a single channel (as in the narrowband scanning mode) or multiple channels (as in the midband or wideband scanning modes).

If the energy profile is not detected, the method returns to 1102. If, on the other hand, the energy profile is detected, step 1106 enters a different scanning mode. For example, if the first scanning mode is a wideband scanning mode, the different scanning mode can be one or more of a narrowband, midband or regular scanning mode.

CONCLUSION

In various embodiments, different scan modes are provided for Bluetooth devices. In at least some embodiments, a narrowband scanning mode is employed that looks for signal energy on individual transmission frequencies at a time. By looking for signal energy rather than decoding transmitted packets, at least some of the components in a Bluetooth device can remain in an idle or rest state. In at least some other embodiments, a midband scanning mode is employed and looks for signal energy across multiple different frequencies at a time. Again, by looking for signal energy across multiple different frequencies rather than decoding transmitted packets, at least some of the components in a Bluetooth device can remain in an idle or rest state. In at least some other embodiments, a wideband scanning mode is employed and looks for signal energies across all relevant frequencies at a time. Further, at least some embodiments enable a Bluetooth device to switch between scanning modes.

Although the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing the claims.

What is claimed is:

1. A method comprising:
    initiating a wideband scan mode in a Bluetooth slave device, the wideband scan mode configured to scan a Bluetooth frequency band while one or more components of the Bluetooth slave device are not awake, the one or more components including a medium access control (MAC) component;
    receiving a signal over multiple channels of the Bluetooth frequency band;
    detecting an energy pattern in the received signal based on a first or a second energy pattern threshold, the first energy pattern threshold configured for detection of a Bluetooth master device and the second energy pattern threshold configured for initiation of another scan mode; and
    responsive to detecting the energy pattern based on the first energy pattern threshold, waking the MAC component of the Bluetooth slave device and entering a normal receive mode to communicate with the Bluetooth master device; or
    responsive to detecting the energy pattern based on the second energy pattern threshold, initiating a midband scan mode in the Bluetooth slave device to determine whether the received signal is noise or a transmission from the Bluetooth master device; and responsive to a determination in the midband scan mode that the signal is from the Bluetooth master device, entering the normal receive mode.

2. The method of claim 1, further comprising building a histogram based on the signal received over the multiple channels and wherein detecting the energy pattern detects one of the energy patterns within the histogram.

3. The method of claim 1, further comprising, responsive to a determination in the midband scan mode that the signal is not from the Bluetooth master device, returning to the wideband scan mode.

4. The method of claim 1, wherein a bandwidth of the Bluetooth frequency is approximately 80 MHz and the multiple channels over which the signal is received include one or more Bluetooth communication channels within the Bluetooth frequency band.

5. The method of claim 1, further comprising generating an interrupt signal that wakes up the one or more components on the Bluetooth slave device to initiate the normal receive mode.

6. The method of claim 1, wherein packets received from the Bluetooth master are not decoded while in the wideband or midband scan modes.

7. The method of claim 1, further comprising, responsive to not detecting the Bluetooth master device in the normal receive mode, classifying the detection of the energy pattern as a false detection.

8. A Bluetooth device comprising circuitry configured to:
    initiate a wideband scan mode, the wideband scan mode configured to scan a Bluetooth frequency band while one or more components of the Bluetooth device are not awake, the one or more components including a medium access control (MAC) component;
    receive a signal over multiple channels of the Bluetooth frequency band;
    detect an energy pattern in the received signal based on a first or a second energy pattern threshold, the first energy pattern threshold configured for detection of a Bluetooth master device and the second energy pattern threshold configured for initiation of another scan mode; and
    responsive to detecting the energy pattern based on the first energy pattern threshold, wake the MAC component of the Bluetooth device and enter a normal receive mode to communicate with the Bluetooth master device; or
    responsive to detecting the energy pattern based on the second energy pattern threshold, initiate a midband scan mode to determine whether the received signal is noise or a transmission from the Bluetooth master device; and responsive to a determination in the midband scan mode that the signal is from the Bluetooth master device, enter the normal receive mode.

9. The Bluetooth device of claim 8, wherein the circuitry is further configured to: build a histogram based on the signal received over the multiple channels; and detect one of the energy patterns within the histogram.

10. The Bluetooth device of claim 8, wherein the circuitry further comprises a window threshold detection circuit that includes at least two peak detectors to detect the energy pattern.

11. The Bluetooth device of claim 10, wherein a high threshold of the window threshold detection circuit is associated with a first one of the peak detectors and a low threshold of the window threshold detection circuit is associated with a second one of the peak detectors.

12. The Bluetooth device of claim 10, wherein the circuitry is further configured to, based on the window threshold detection circuit, wake the Bluetooth device by generating an interrupt signal that wakes the one or more components of the Bluetooth device.

13. The Bluetooth device of claim 12, wherein the interrupt signal wakes a digital signal processor and an analog-to-digital converter of the Bluetooth device.

14. The Bluetooth device of claim 8, wherein the midband scan mode scans a frequency band of about 5 MHz and consumes more power than the wideband scan mode.

15. The Bluetooth device of claim 8, wherein the circuitry comprises an open loop voltage controlled oscillator configured to receive the signal over the multiple channels of the Bluetooth frequency.

16. One or more computer-readable hardware devices comprising processor-executable instructions that, responsive to execution by a processor, cause a Bluetooth device to:
    initiate a wideband scan mode of the Bluetooth device, the wideband scan mode configured to scan a Bluetooth frequency band while a medium access control (MAC) component of the Bluetooth device is not awake;
    receive a signal over multiple channels of the Bluetooth frequency band;

detect an energy pattern in the received signal based on a first or a second energy pattern threshold, the first energy pattern threshold configured for detection of a Bluetooth master device and the second energy pattern threshold configured for initiation of another scan mode; and responsive to detecting the energy pattern based on the first energy pattern threshold, wake the MAC component of the Bluetooth device and enter a normal receive mode to communicate with the Bluetooth master device; or responsive to detecting the energy pattern based on the second energy pattern threshold, initiate a narrowband scan mode of the Bluetooth device to determine whether the received signal is noise or a transmission from the Bluetooth master device; and responsive to a determination in the narrowband scan mode that the signal is from the Bluetooth master device, enter the normal receive mode to communicate with the Bluetooth master device.

17. The one or more computer-readable hardware devices of claim 16, wherein a digital signal processor and an analog-to-digital converter of the Bluetooth device are not awake while in the wideband scan mode.

18. The one or more computer-readable hardware devices of claim 17 comprising additional processor-executable instructions that, responsive to execution by the processor, cause the Bluetooth-enabled device to wake the digital signal processor in response to initiation of the narrowband scan mode.

19. The one or more computer-readable hardware devices of claim 16 comprising additional processor-executable instructions that, responsive to execution by the processor, cause the Bluetooth-enabled device to return to the wideband scan mode in response to a determination in the narrowband scan mode that the signal is not from the Bluetooth master device.

20. The one or more computer-readable hardware devices of claim 16, wherein the narrowband scan mode scans a frequency band of about 1 MHz and consumes more power than the wideband scan mode.

* * * * *